(12) United States Patent
Covalenco et al.

(10) Patent No.: US 7,986,149 B2
(45) Date of Patent: Jul. 26, 2011

(54) SYSTEM AND METHOD FOR ADAPTIVE LOAD FAULT DETECTION

(75) Inventors: Andrei Covalenco, Bucharest (RO); Bogdan Bumbacea, Bucharest (RO)

(73) Assignee: Infineon Technologies Austria AG, Villach (AT)

( * ) Notice: Subject to any disclaimer, the term of this patent is extended or adjusted under 35 U.S.C. 154(b) by 520 days.

(21) Appl. No.: 12/194,333

(22) Filed: Aug. 19, 2008

(65) Prior Publication Data

US 2010/0050024 A1 Feb. 25, 2010

(51) Int. Cl.
*G01R 31/02* (2006.01)
*H02H 3/00* (2006.01)
(52) U.S. Cl. ............... 324/555; 324/537; 361/101
(58) Field of Classification Search .......... 324/535, 324/537, 555; 361/101
See application file for complete search history.

(56) References Cited

U.S. PATENT DOCUMENTS

| | | | | |
|---|---|---|---|---|
| 5,229,707 A * | 7/1993 | Szepesi et al. | .......... | 323/222 |
| 5,621,601 A * | 4/1997 | Fujihira et al. | .......... | 361/93.9 |
| 5,903,422 A * | 5/1999 | Hosokawa | .......... | 361/93.1 |
| 5,973,551 A * | 10/1999 | Mitsuda | .......... | 327/543 |
| 7,075,373 B2 * | 7/2006 | Briskin et al. | .......... | 330/298 |
| 7,079,368 B2 * | 7/2006 | Ishikawa et al. | .......... | 361/93.1 |
| 7,593,245 B2 * | 9/2009 | Djenguerian et al. | .......... | 363/95 |
| 7,613,019 B2 * | 11/2009 | Kroes | .......... | 363/56.03 |
| 7,813,096 B2 * | 10/2010 | Takahashi et al. | .......... | 361/93.1 |
| 2007/0177322 A1 * | 8/2007 | Jacobs | .......... | 361/100 |
| 2009/0116161 A1 * | 5/2009 | Takahashi et al. | .......... | 361/100 |

* cited by examiner

*Primary Examiner* — Timothy J Dole
(74) *Attorney, Agent, or Firm* — Slater & Matsil, L.L.P.

(57) ABSTRACT

In one embodiment, a method for sensing an output fault condition is disclosed. The method includes monitoring an error signal that indicates an output fault condition, and monitoring an input signal having a duration. An error flag is set if a fast switching mode is detected and if the error signal is asserted within a specified time interval during the input signal duration.

18 Claims, 8 Drawing Sheets

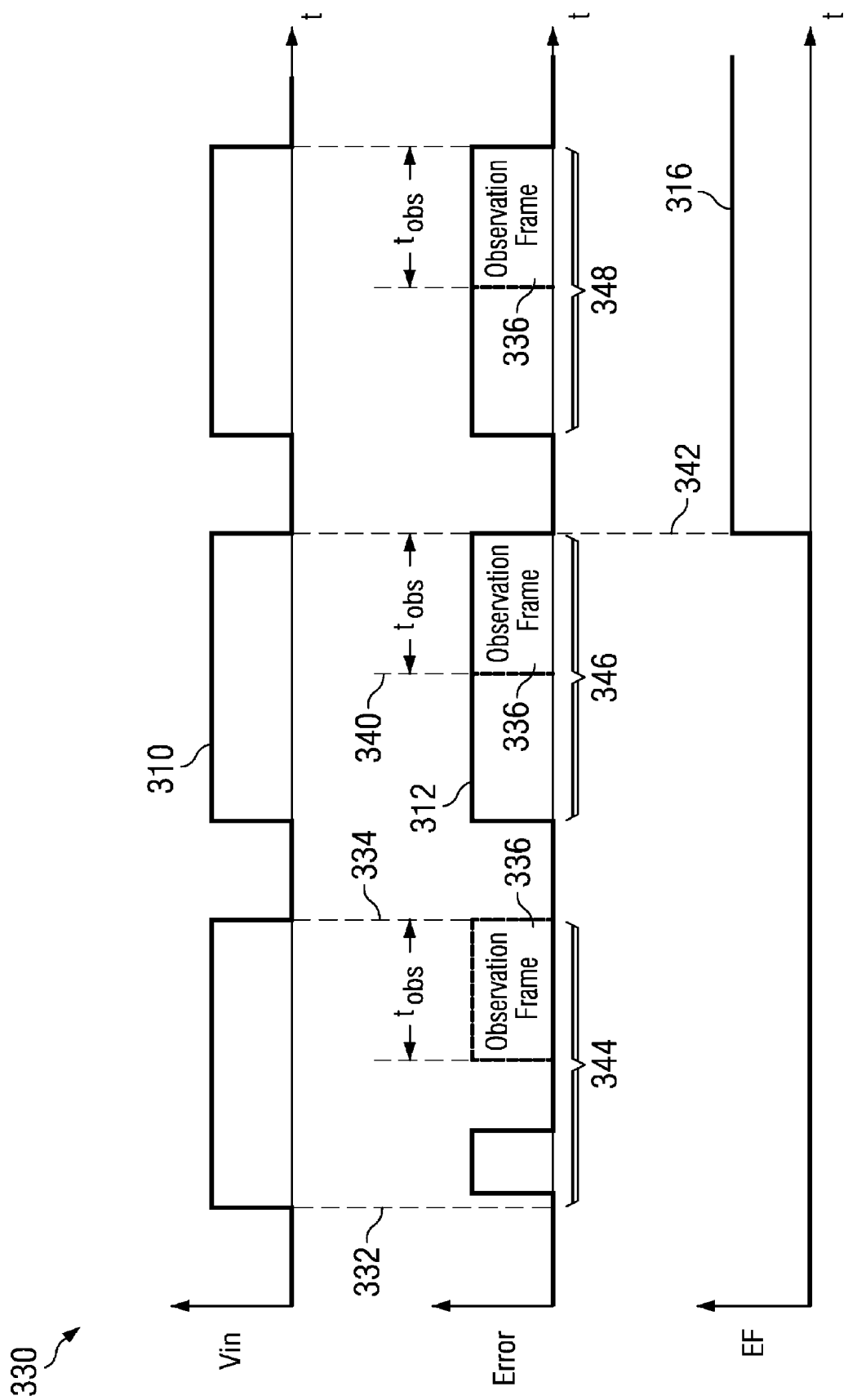

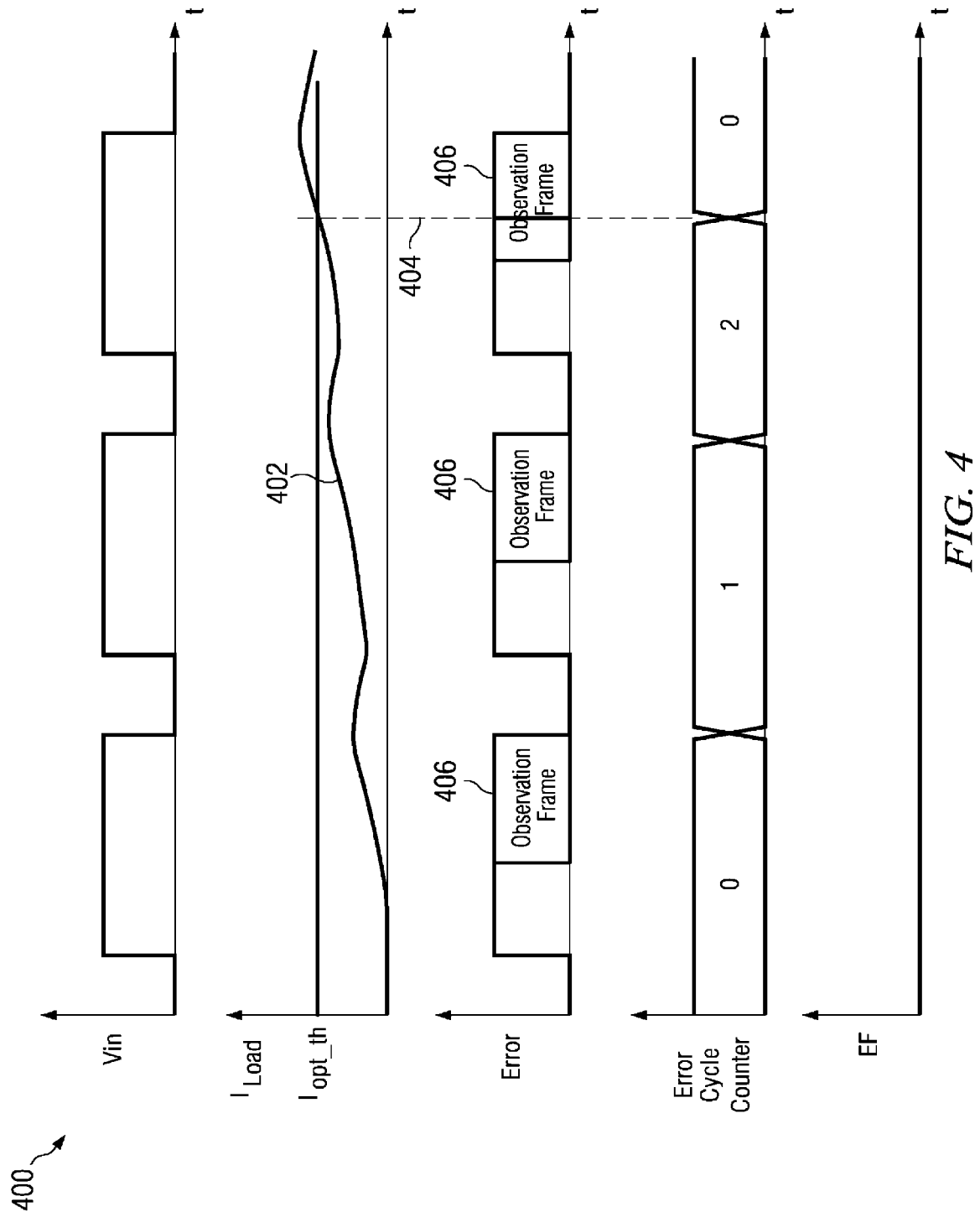

SYSTEM AND METHOD FOR ADAPTIVE LOAD FAULT DETECTION

CROSS-REFERENCE TO RELATED APPLICATIONS

This application relates to the following co-pending and commonly assigned patent applications: Ser. No. 12/165,262, filed Jun. 30, 2008, entitled "Speed Recognition for Half Bridge Control," which application is hereby incorporated herein by reference.

TECHNICAL FIELD

This invention relates generally to switching load systems and more particularly to a system and method for load fault detection.

BACKGROUND

As electronic systems are becoming more power efficient, fault tolerance to non-ideal loads and short circuit conditions have become more critical. Many circuits and systems include methods of detecting load fault conditions and mitigating their effects. For example, power driving devices contain output current sensors and monitors that will sense high current conditions brought about by short circuits or faulty loads, or low current conditions brought about by open circuits or other circuit faults. If a short circuit condition is detected, corrective measures can be such as shutting off the driver and/or reporting the fault to a controller.

Output current detection is relatively straightforward in situations where the load is being driven by a continuous signal or a low frequency signal, because the instantaneous output current at any particular time is usually an adequate indication of load conditions. In pulse modulated systems such as data communication systems and pulse width modulated power supply systems, however, the switching nature of the systems output creates some difficulty in load fault sensing.

In capacitively loaded systems, for example, the initial current drive at the onset of a pulse may be high enough to approximate short circuit or load fault conditions. In inductively loaded systems, on the other hand, the onset of a pulse may approximate an open load condition as the load inductance begins to conduct current. These systems are prone to false load fault detection if only simple current detection techniques are used.

One possible solution to this problem is to require the output current sensor to report a load fault condition over a predetermined period of time before recognizing a load fault condition. For example, in order for a load fault to be recognized, the output current detector must indicate a high current state or a low current state for a period of time that exceeds initial startup transients.

As pulse-width and pulse-code modulated systems are increasing in output frequency, however, requiring a detected current to be monitored over an extended period of time poses some difficulties. For example, if a pulse width is less than or on the order of a predetermined output fault detection time, an output fault will be inadequately detected. Consequently, higher power dissipated and possible system damage may result.

What are needed are systems and methods of fault detection for high frequency and/or narrow pulse-width switching systems.

SUMMARY OF THE INVENTION

In one embodiment, a method for sensing an output fault condition is disclosed. The method includes monitoring an error signal that indicates an output fault condition, and monitoring an input signal having a duration. An error flag is set if a fast switching mode is detected and if the error signal is asserted within an observation frame, the observation frame comprising a specified time interval during the input signal duration.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a-3d illustrate waveforms and timing diagrams of error filters according to embodiments of the present invention;

FIG. 4 illustrates waveforms and timing diagrams for a error filtering over a number of cycles according to embodiments of the present invention.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method for detecting and declaring a load fault condition in a power switching device. This invention may also be applied to other circuits and systems that require load fault detection such as general purpose electronic and semiconductor circuits.

Figure 1A:
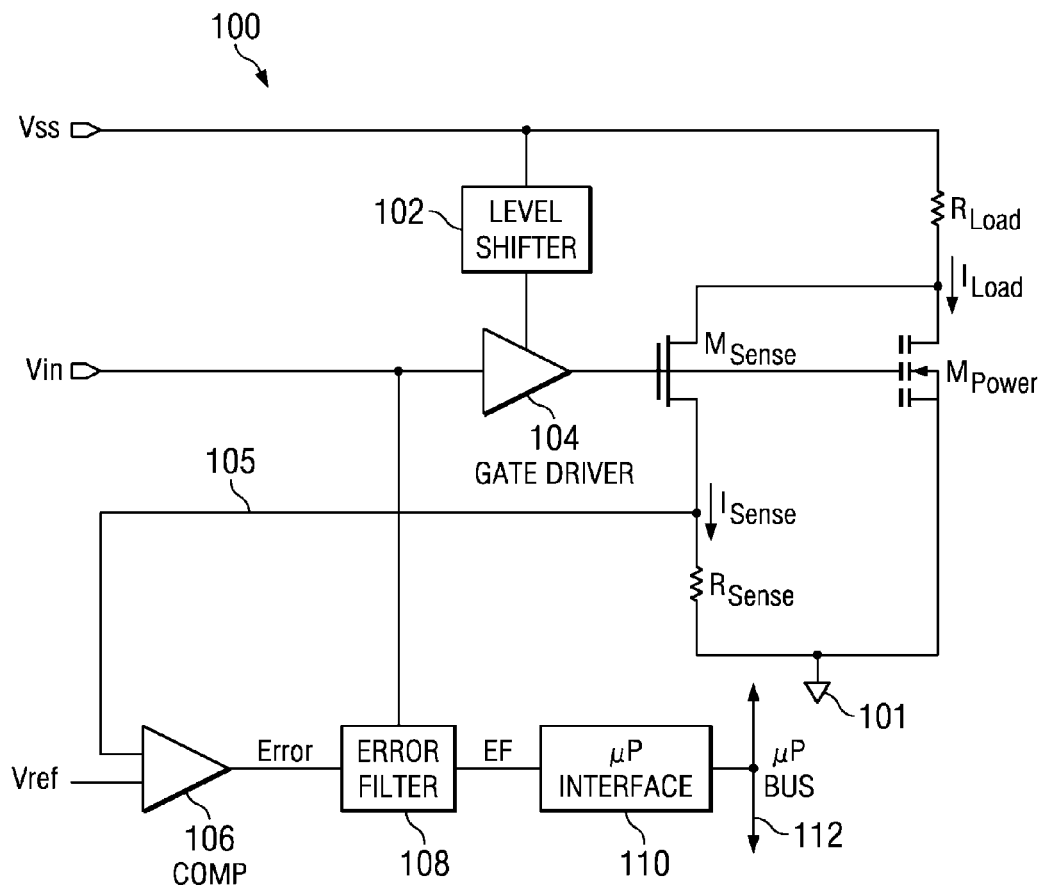
FIGS. 1a-1b illustrate schematics of an embodiment of the present invention.

A schematic showing a power switch system 100 according to embodiments of the present invention is shown in FIG. 1a. The driver amplifier contains an output power transistor $M_{Power}$, a current sense transistor $M_{Sense}$, and a current sense resistor $R_{Sense}$. The gates of both the power transistor $M_{Power}$ and current sense transistor $M_{Sense}$ are driven by gate driver 104 responsive to input signal $V_{In}$. In some embodiments of the present invention, $V_{In}$ is controlled by a microcontroller or microprocessor. In preferred embodiments, the power supply of gate driver 104 is coupled to level shifter 102 in order constrain the voltage on the gates of transistors $M_{Power}$ and $M_{Sense}$ so that the gates of these transistors are not damaged by a high voltage on Vss. In preferred embodiments, Vss can range in value from about 4 V to about 18 V or higher. Level shifter 102 and gate driver 104 are implemented according to conventional techniques known in the art. It should be noted that the actual supply voltage is application specific. For example, the voltage required to drive machinery or incandescent lamps may be higher than the voltage required to drive an LED or a data signal.

In preferred embodiments of the present invention, the drains of power transistor $M_{Power}$ and current sense transistor $M_{Sense}$ are coupled to load $R_{Load}$, which is representative of any external load. In some embodiments, however, $R_{Load}$ may also have a local resistor to provide bias to the circuit in the absence of a load. In preferred embodiments, $M_{Sense}$ is sized to be a fraction of $M_{Power}$ so that an accurate, power-efficient current can be made without dissipating unnecessary power. In preferred embodiments of the present invention, $M_{Power}$ is typically between about 1000 and 2000 times larger than $M_{Sense}$. For example, if $M_{Power}$ is 1000 times larger than $M_{Sense}$, a current $I_{Sense}$ of about 100 μA would represent a load current $I_{Load}$ of about 100 mA.

Current $I_{Sense}$ flows though resistor $R_{Sense}$, and a voltage proportional to $I_{Sense}$ is developed across $R_{Sense}$ at node 105. This voltage is compared to $V_{Ref}$ by comparator 106. The output of comparator 106 is an Error signal that signifies an instantaneous load fault condition. In preferred embodiments of the present invention, $V_{Ref}$ is chosen to be a value that corresponds to an output value representing a high current condition. This high current condition may be chosen to be a multiple of an expected nominal current condition. For example, if the nominal current draw of a particular load is about 100 mA, then $V_{Ref}$ may be chosen to be about three times the nominal current, or about 300 mA. In preferred embodiments, comparator 106 has hysteresis to prevent metastable operation when the voltage at node 105 is at or near the $V_{Ref}$ threshold. Alternatively, $V_{Ref}$ may be chosen to correspond to higher or lower currents. For example, $V_{Ref}$ may represent a very high current that corresponds to an external short circuit, or the onset of high current condition that may damage the output driver circuit. In other embodiments, $V_{Ref}$ may represent a very low current condition indicative of an open circuit. In further embodiments of the present invention, node 105 may be compared to a number of different thresholds in order to monitor different types of load fault conditions. Multiple thresholds can be detected by routing node 105 to multiple comparators, by successively changing $V_{Ref}$ and polling the Error signal, or by any other known technique.

For purposes that will be described hereinbelow, the Error signal and Vin are coupled to Error Filter 108. Error Filter 108 processes and filter the Error signal and outputs error flag EF. In preferred embodiments of the present invention, error flag EF is coupled to a microprocessor interface 110 that communicates with microprocessor bus 112. The microprocessor bus is preferably under the control of a system controller comprising a microprocessor. In alternative embodiments of the present invention, other system controllers may be used such as micro computers, or dedicated system controllers. In further alternative embodiments, the error flag may be used locally for mode control, or used to shut down local circuitry when load faults are detected. For example, if a very high current fault is detected, driver circuit 100 can be configured to immediately shut off transistor $M_{Power}$ without having to utilize microprocessor interface 110.

In some embodiments of the present invention, driver amplifier system 100 may reside on a single semiconductor integrated circuit. In other embodiments, functional blocks may be shared among different circuits, or even among external circuitry. For example, resistor $R_{Sense}$ may be an on-chip resistor, or an external resistor.

Figure 1B:
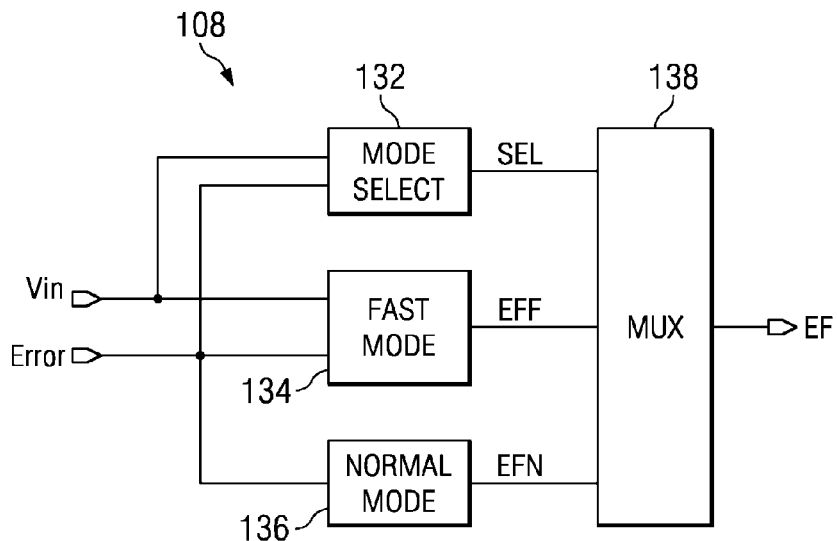

Turning to FIG. 1b, a block diagram of Error filter 108 is shown. In preferred embodiments of the present invention, error filter 108 has a fast mode error filter, a normal mode error filter, and mode select circuitry. The fast mode error filter processes the Error signal and produces error flag EFF under high frequency input conditions, for example, when the input frequency is greater than 10 KHz, or when power switch 100 is activated repeatedly for short periods of time. The normal mode error filter processes the Error signal under continuous output conditions, or under conditions where the output frequency does not exceed 10 KHz, and produces error flag EFN. Mode select 132 determines whether both the fast and normal modes or normal mode only are used for Error signal filtering based on the Error signal input and amplifier input Vin. Selector 138 selects between EFF and EFN or EFN based on the output of mode select 132. In alternative embodiments of the present invention, Error filter 108 can be implemented according to other architectures. For example, normal mode filter 136 may be continually active, while fast mode filter 134 is activated only during a fast switching mode. Here, Mux 138 can be replaced by an OR gate. In further embodiments, depending on the application, the error filter may contain only the fast mode error filter in applications where only high frequency signals are anticipated.

Figure 2A:
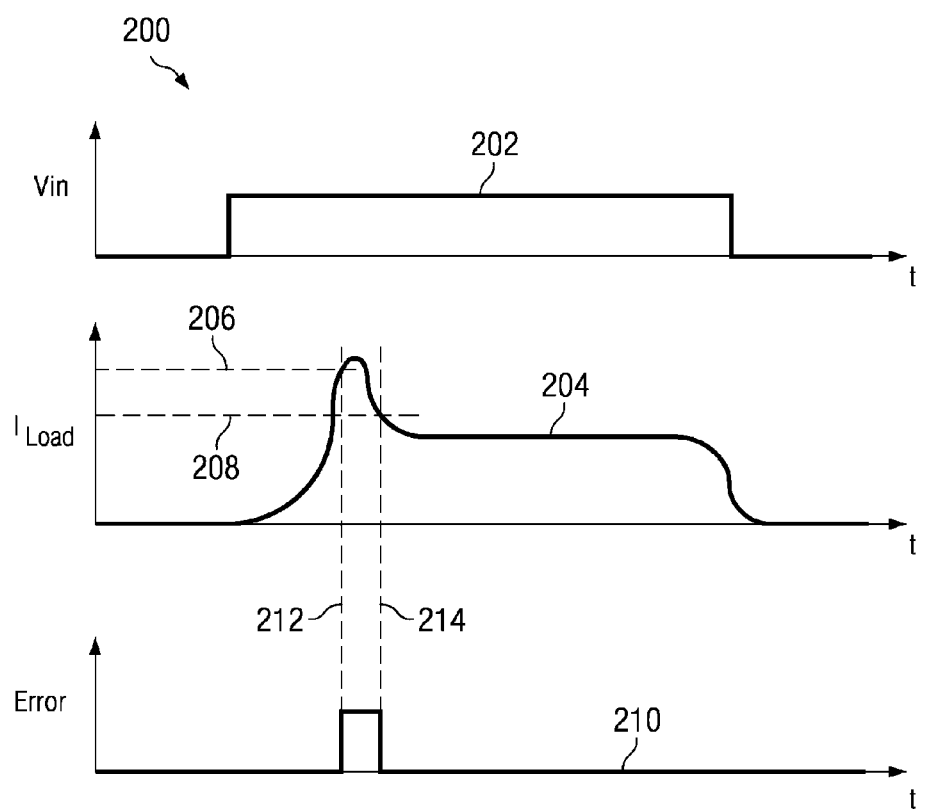
FIGS. 2a-2b illustrate error detection waveforms and timing diagrams of embodiments of the present invention.
Figure 2B:
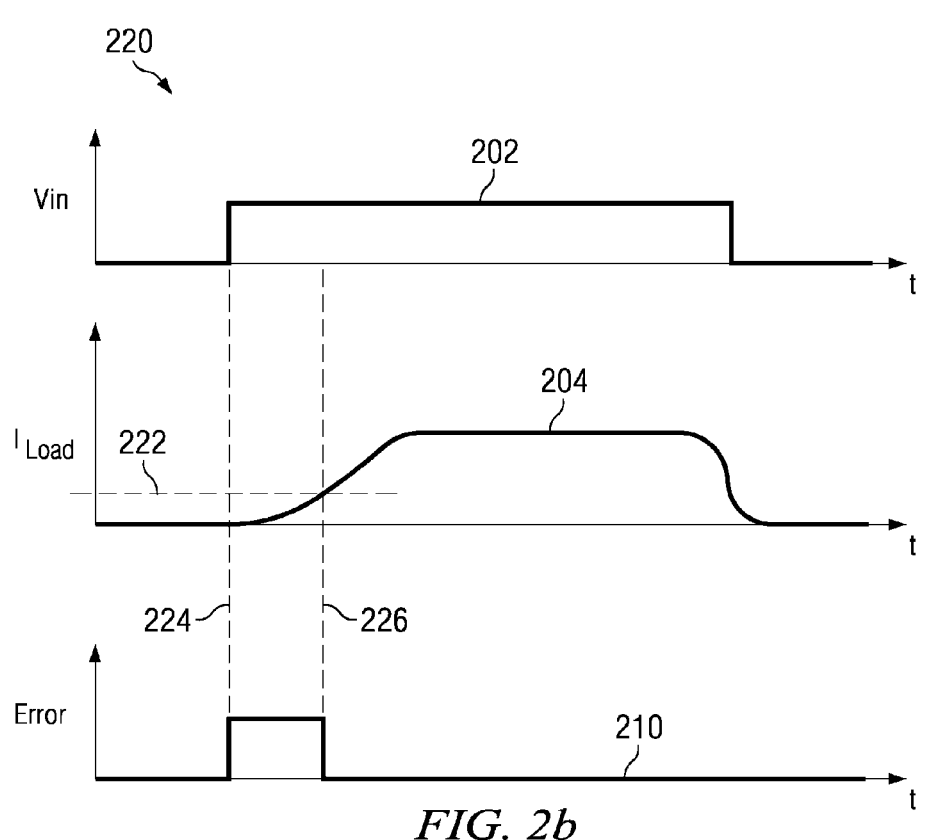

FIGS. 2a-2b describe the behavior of the Error signal with respect to output current $I_{Load}$ for embodiments of the present invention.

FIG. 2a illustrates the behavior of Error signal 210 in conditions where output amplifier 100 is operating under a heavy capacitive load. In this case, when driver amplifier 100 (FIG. 1a) turns on, $I_{Load}$ is initially very high when the capacitive load begins to charge. Waveform 202 shows an example input signal Vin, and waveform 204 shows the corresponding amplifier $I_{load}$. Because of the capacitive load, the $I_{Load}$ current waveform 204 undergoes a large positive excursion while the output capacitance is charging. Once the $I_{Load}$ current exceeds a threshold 206 representing a rising current threshold, Error signal 210 is activated. Once the $I_{Load}$ current decreases below threshold 208 representing a falling current threshold, Error signal 210 is deactivated. By making the rising threshold 206 greater than falling threshold 208, hysteresis is introduced into the system, making the system less prone to metastabily. In applications where capacitive loads must be driven, the presence of a capacitive load is not typically indicative of an output fault condition. The triggering of the error signal under capacitive loading conditions should not be reported as an error, and is, therefore, preferably filtered by the Error Filter.

FIG. 2b, on the other hand, illustrates the relationship between output current $I_{Load}$ 204 and Error signal 210 under when the driver amplifier is loaded by a heavy inductive load. Under inductive loads, $I_{Load}$ 204 starts out as a low current which increases over time as current begins to flow in the inductor. In embodiments that have open circuit detection, the Error signal is asserted if output current $I_{Load}$ 204 is less than open circuit threshold 222 and if Vin 202 is asserting. Error signal rises at edge 224 when Vin 202 goes high but $I_{Load}$ 204 is less than threshold 222, and subsequently falls when $I_{Load}$ 204 exceeds threshold 222. Similar to the capacitively loaded amplifier case shown in FIG. 2a, an output fault is signaled even though there is no issue with an open circuit at the output. The detected open circuit must therefore also be filtered by error filter 108 (FIG. 1). As can be seen by the behavior of the Error signal in FIGS. 2a and 2b, in preferred embodiments of the present invention, the Error signal will go high only while the load is activated (e.g., whenever Vin is high). In alternative embodiments of the present invention, however, the Error signal may be high even when the load is deactivated.

FIGS. 3a-3d illustrate the operation of error filter according to embodiments of the present invention.

Figure 3A:
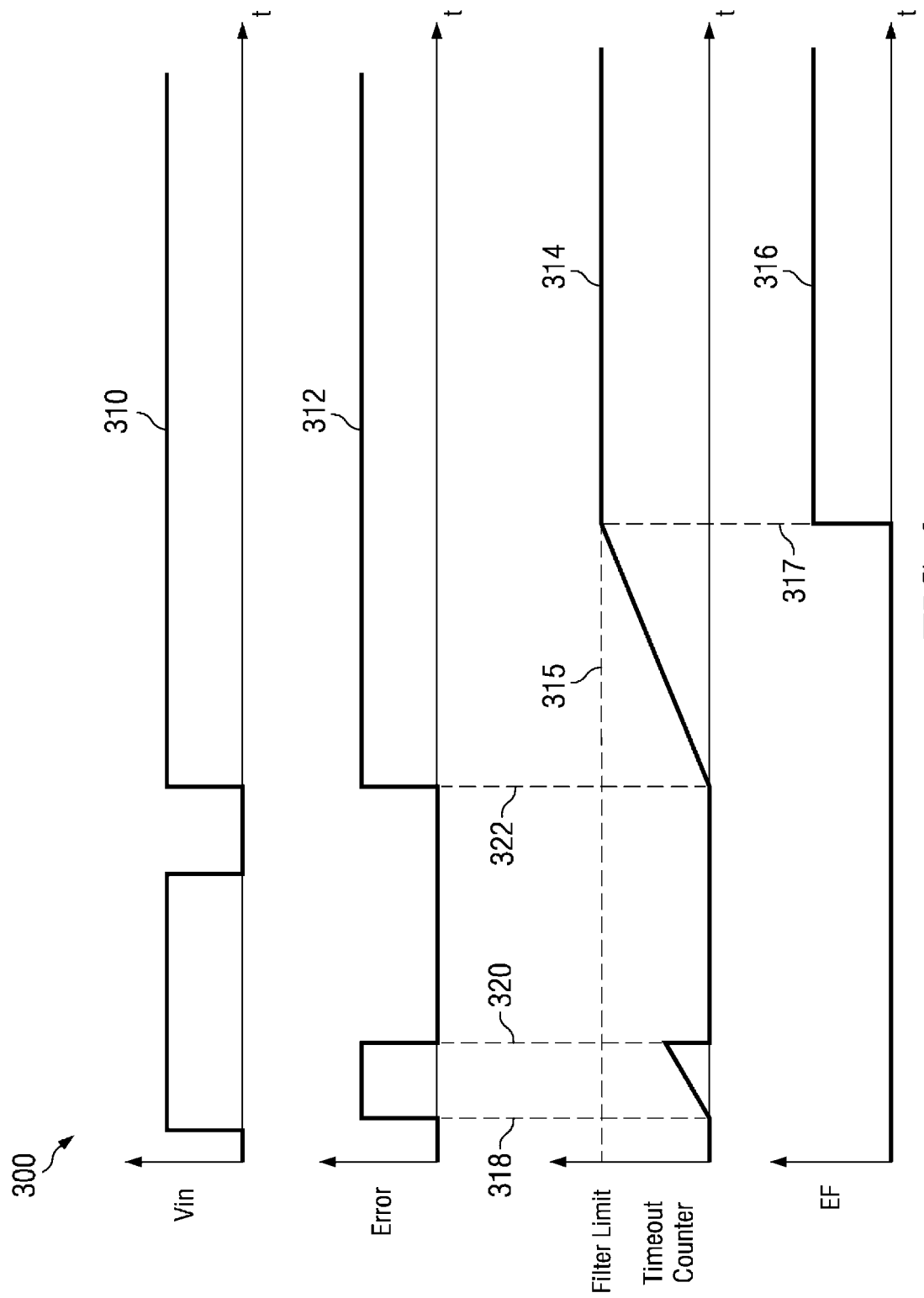

FIG. 3a illustrates a timing and waveform diagram of the error filter in normal mode, where the frequency of Vin is at a low frequency, or driver amplifier 100 (FIG. 1a) is operating under DC conditions. According to an embodiment of the present invention, a timeout counter is activated when error signal 312 is activated. For example, timeout counter trace 314 becomes active at edge 318 when error signal 312 is asserted. In cases where power switch 100 is capacitively or inductively loaded, error signal 312 is active for a short period of time, and then goes low again at edge 320. When error signal 312 becomes active at edge 322, however, the signal remains high, which is indicative of a true output load fault condition. When the timeout counter reaches filter limit 315, error flag EF 316 becomes active at edge 317 signaling the fault.

In some embodiments of the present invention, timeout counter signal 314 can be generated by a binary counter, in other embodiments of the present invention, other circuits, systems and methods can be used to perform a timeout counter function. For example, an analog timeout counter can utilize a current charging a capacitor that is monitored with a comparator. Other digital counters, for example, non-binary counters such as grey code counters and shift registers, for example, can be used. In preferred embodiments of the present invention, the timeout counter is reset when error signal 312 is deasserted. In alternative embodiments to the present invention, timeout counter signal 314 can be decremented until the count reaches zero or some other predetermined number.

It can be seen the normal mode of operation shown in FIG. 3a suffers some limitations if Vin 310 is operated at a higher frequency. For example, in the case where the pulse-width of Vin is less than the time it takes for the timeout counter to reach the limit of Filter Limit 315, the error flag will not be triggered because the counter will not be able to reach the Filter limit. This situation can pose problems in high frequency PWM systems such as lighting systems where lighting components are prone to damage or removal thereby causing load faults.

Turning to FIG. 3b, a timing and waveform diagram illustrating the fast operation mode. In the fast operation mode, error signal 312 is monitored during an observation frame time period 336. In preferred embodiments of the present invention, the observation frame time period begins at a time period $t_{obs}$ preceding the falling edge of the driver amplifier input signal Vin 310. Parameter $t_{obs}$ is application specific, for example in applications such as driving DC motors, $t_{obs}$ may be between 5 µs and about 10 µs. By not monitoring the error signal during the beginning of Vin 310 input periods 344, 346 and 348, the system is less prone to false load fault indicators. In alternative embodiments of the present invention, however, the observation frame time period may begin and end at different times relative to a period of input signal Vin 310.

Vin input period 344 illustrates the case where an inductive (for open load detection) or capacitive (for short circuit detection) start-up transient triggers error signal 312. Because error signal 312 is not used during this time to activate error flag EF 316, a false error flag signal is not asserted. During input period 344, on the other hand, the error signal stays asserted during the entire observation time frame. Consequently, at the falling edge 342 of Vin 310, error flag ER 316 becomes asserted. During the next Vin input period 346, error signal 312 remains high during the observation frame time period and the error flag, therefore, remains high.

Figure 3C:
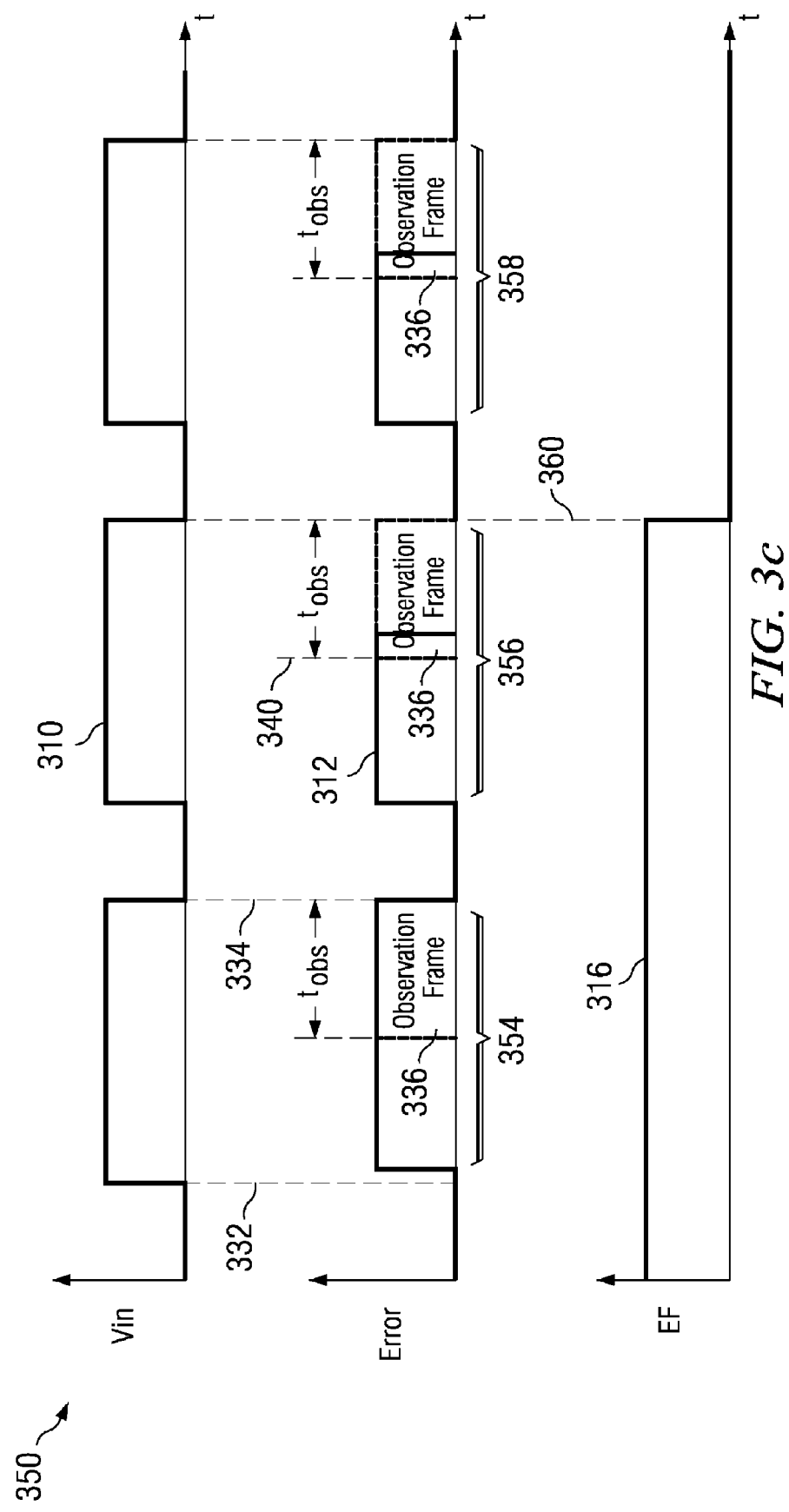

FIG. 3c shows further examples of the behavior of error filter 108 (FIG. 1) according to preferred embodiments of the present invention. During Vin input period 354, error signal 312 remains high during the observation frame time period and the error flag, therefore, remains high. During the next Vin input period 356, however, error signal 312 becomes deasserted during observation time frame interval 336. Because error signal 312 was not asserted during the entirety of observation time frame interval 336, error flag EF 316 becomes deasserted at the falling edge 360 of observation frame 336. Again during Vin input period 358, error flag 316 remains deasserted because error signal 312 does not remain active over the entirety of observation time frame interval 336.

Figure 3D:
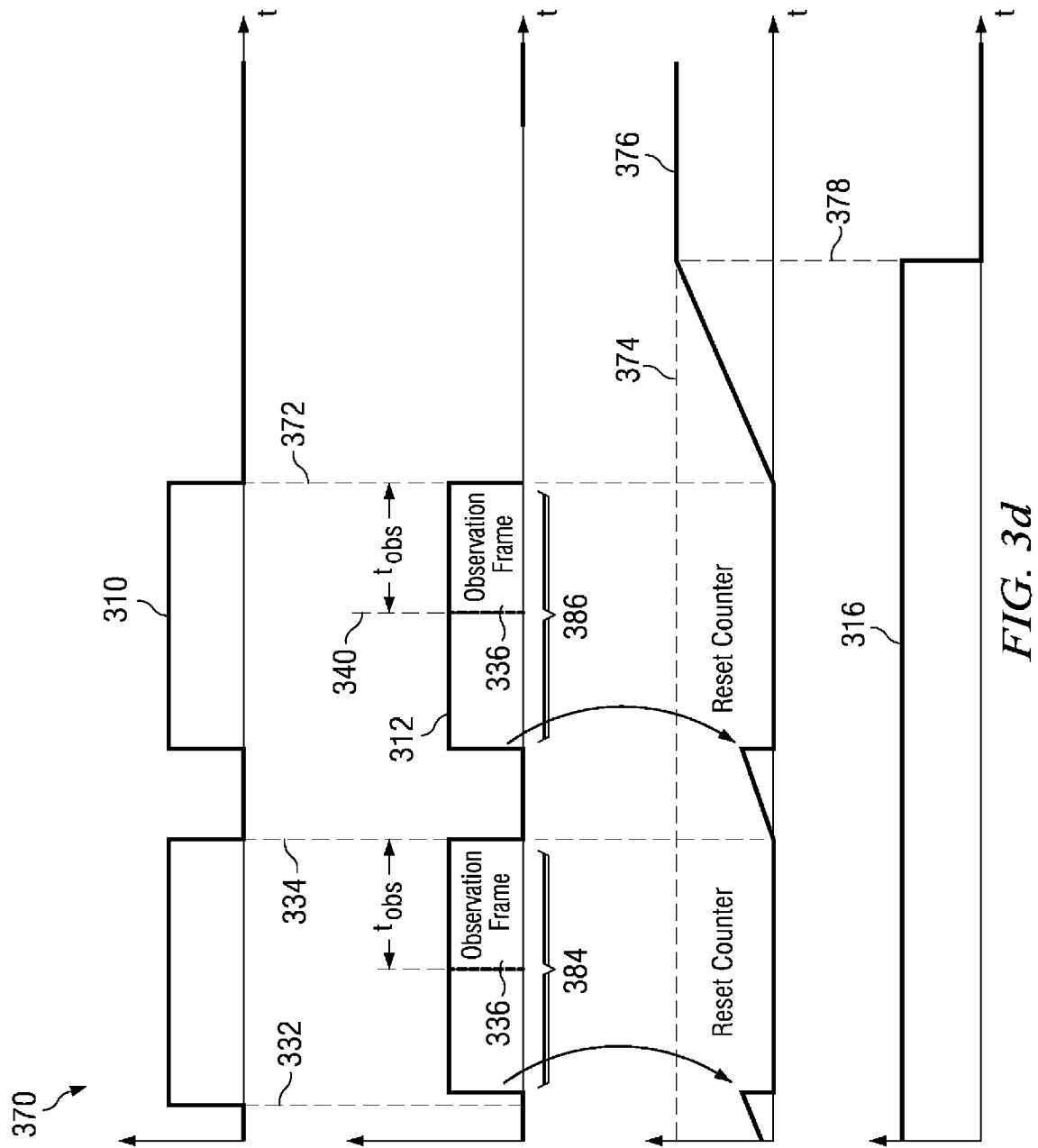

Turning to FIG. 3d, a mode of deasserting the error flag is presented. In preferred embodiments of the present invention, error flag 316 is reset if the error signal remains deasserted for a predetermined period of time. The counter is triggered by the falling edge of internal error signal 312. For example, when error signal 312 becomes deasserted, a mode counter is activated commencing a mode count 376. If the mode count does not reach Count Limit 374 before the next assertion of the error signal 312, error flag EF 316 remains high as shown at the end of Vin input period 384 and at the beginning of Vin input period 386. If, however, mode counter 376 reaches Count Limit 374 prior to the next assertion of error signal 312, error flag EF 316 is deasserted at edge 378 and the mode is changed from fast mode to normal mode. Once the system is in normal mode, the system operates according to the diagram of FIG. 3a according to preferred embodiments of the present invention.

FIG. 4 illustrates error filtering over a number of cycles for highly inductive loads according to an embodiment of the present invention. According to this embodiment, the Error signal is asserted whenever output current $I_{Load}$ 402 remains under threshold $I_{opl\_th}$. If the Error signal is asserted during the entire observation frame 406, the Error Cycle Counter is incremented. If the error signal is not active during the entire observation frame 406, the Error Cycle Counter is reset. For example, the Error Cycle Counter is reset when output current $I_{Load}$ 402 exceeds threshold $I_{opl\_th}$ at time 404. In embodiments of the present invention, error flag EF can be programmed to be asserted whenever the Error Cycle Counter exceeds a numeric threshold. For example, in a preferred embodiment, error flag EF is asserted when the Error Cycle Counter reaches 3. The number of filtering cycles, however, can also be chosen according to the requirements of the particular application. In alternative embodiments, error filtering can be performed over a number of cycles for highly capacitive loads as well as for highly inductive loads.

When the Error Cycle Counter reaches the threshold at which error flag EF is asserted, the clearing of EF can be achieved on the first clock cycle when no error is observed during the entirety of the observation frame, or by decrementing the Error Cycle Counter until it reaches a lower threshold (not shown) in embodiments of the present invention.

Some driver amplifier applications require a high switching frequency (over 10 KHz, for example) to drive the load. At such high frequencies, however, detecting load faults becomes more difficult because transient errors due to highly capacitive or inductive loading constitute a higher percentage of the output pulsewidth, resulting in the false assertion of error flag EF. One way to avoid false errors is to relate the falling edge of a fixed-length observation frame to the falling edge of the output pulse delivered to the load as shown in FIG. 3b, and as described hereinabove. In alternative embodiments of the present invention, false errors are avoided by shortening the observation frame duration so that random glitches in the order of a few hundred nanoseconds or less are easily filtered. Furthermore, determining the maximum frequency at which the driver amplifier can operate without apparent load errors is desirable to avoid large design margins between the actual designed maximum operating frequency and the maximum possible operating frequency.

Figure 5:
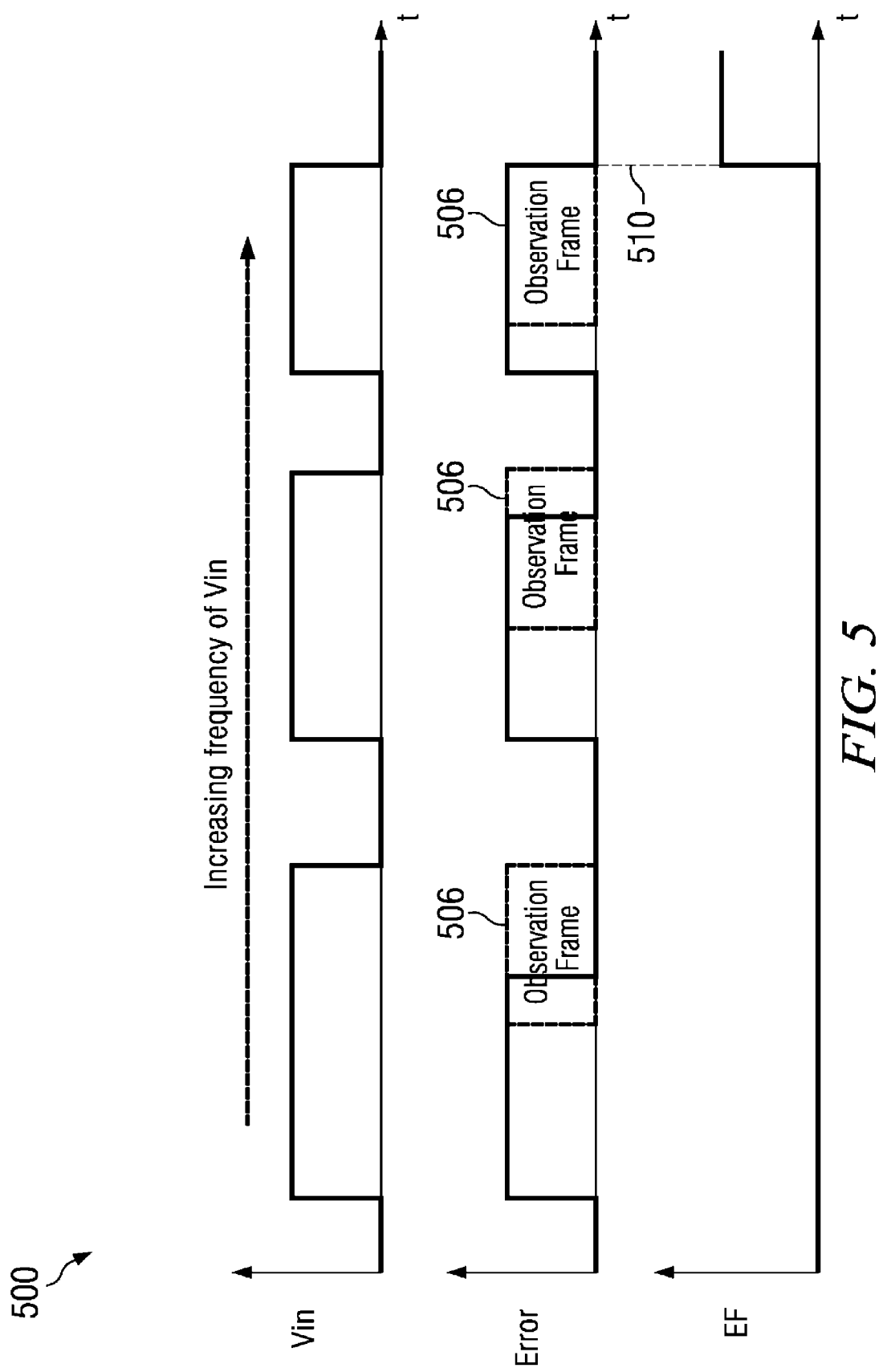
FIG. 5 illustrates waveforms and timing diagrams for an adaptive method of determining a fast mode switching threshold according to embodiments of the present invention.

FIG. 5, illustrates waveforms resulting an embodiment method of adaptively determining a maximum frequency at which fast mode error filtering can be operated. During system startup, or during a calibration sequence, the microprocessor or microcontroller presents the error filter with an input $V_{in}$, whose frequency increases over time. At lower frequencies, the Error signal is not active over the entirety of observation frame 506. When the frequency of $V_{in}$ reaches a critical frequency $f_{crit}$, the Error signal becomes active during entire observation frame 506 at time 510. Critical frequency $f_{crit}$ is then stored in system memory for later use by the system for determining the maximum frequency at which the driver amplifier can be operated.

In preferred embodiments of the present invention, the value of $f_{crit}$ is stored in a non-volatile memory such as flash memory. In alternative embodiments, other memory types may be used. Alternatively, the pulsewidth of $V_{in}$ can be decreased over time and a critical minimum pulsewidth $\tau_{crit}$ is stored in memory to assist in error filter mode determination. In some embodiments of the present invention, $f_{crit}$ is determined at the time of system manufacture and the stored value of $f_{crit}$ is used during later use without the need for recalibration. Detecting the frequency threshold $f_{crit}$ in this adaptive manner provides a simple and cost effective way of determining the maximum operation frequency of the driver amplifier. Operating the driver amplifier at the maximum possible operating frequency is desirable in driver applications where higher frequency operation is more power efficient.

Critical frequency $f_{crit}$ is dependent on the load of the driver amplifier. For example, loads of higher capacitance result in a lower critical frequency $f_{crit}$ because the Error signal is active for a longer duration of each $V_{in}$ pulse. Likewise, higher inductive loads will also result in lower critical frequencies $f_{crit}$. In systems with variable load capacitance or load inductance, a pre-programmed or pre-calibrated value for $f_{crit}$ may not provide optimal system performance. In embodiments of the present invention, the microprocessor or microcontroller slightly reduces the frequency of $V_{in}$ when the error flag EF is asserted to determine whether the fault is an artifact of high frequency operation, or whether the detected fault is a true load fault or line fault such as a short circuit or an open circuit. If the error flag EF de-asserts at a slight lowering of frequency, then the fault is considered an artifact of high frequency operation and the microprocessor can continue to operate the driver amplifier at the slightly lowered frequency. Subsequently, the value of this slightly lowered frequency can be stored in the system as $f_{crit}$.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A method for sensing an output fault condition, the method comprising:
    monitoring an error signal, the error signal indicating the output fault condition;
    monitoring an input signal, the input signal comprising a duration;
    setting an error flag if the error signal is asserted within an observation frame and if a fast switching mode is detected, the observation frame comprising a specified time interval during the input signal duration, wherein the specified time interval begins at a first specified period of time before an end of the input signal duration, and the specified time interval ends at an end of the input signal duration; and
    selecting a switching mode, the selecting comprising
        measuring a period of time the error signal is not asserted;
        asserting a normal switching mode if the period of time the error signal is not asserted exceeds a second specified time period, and
        asserting the fast switching mode if the period of time the error signal is not asserted does not exceed the second specified time period.

2. The method of claim 1, wherein the first specified period of time comprises a duration of between about 5 μs and about 10 μs.

3. The method of claim 1, further comprising resetting the error flag if the error signal is not asserted during the entire observation frame.

4. The method of claim 1, further comprising resetting the error flag if the error signal is not asserted longer than a second specified time period.

5. The method of claim 1, wherein setting the error flag further comprises setting the error flag if the normal switching mode is asserted and if the error signal is asserted for a time period greater than a third specified time interval.

6. The method of claim 1, wherein selecting the switching mode further comprises:
    measuring an input signal frequency;
    asserting a normal switching mode if the input signal frequency does not exceed a predetermined frequency; and
    asserting the fast switching mode if the input signal frequency exceeds the predetermined frequency.

7. The method of claim 1, further comprising generating the error signal, the generating comprising:
    monitoring an output variable; and
    asserting the error signal if the output variable indicates a high output current.

8. The method of claim 7, further comprising asserting the error signal if the output variable indicates an open circuit.

9. The method of claim 7, wherein:
    the output variable comprises an output current; and monitoring the output variable comprises comparing the output current to a first preset threshold.

10. The method of claim 9, wherein:
monitoring the output variable further comprises comparing the output current to a second preset threshold, the second preset threshold greater than the first preset threshold;
the first preset threshold represents a high output current condition; and
the second preset threshold represents a short circuit condition.

11. A semiconductor circuit comprising:
a power switching circuit;
an output current sensor coupled to the power switching circuit; and
a comparator comprising
   a first input coupled to the output current sensor, and
   a second input coupled to a reference;
an error filter coupled to an output of the comparator and an input of the power switching circuit, the error filter configured to set an error flag if the output of the comparator is asserted during a last interval of a signal pulse at the input of the power switching circuit, wherein the error filter is configured to set the error flag if
   the output of the comparator is asserted during a last interval of a signal pulse at the input of the power switching circuit and a fast mode signal is asserted, or
   the output of the comparator is asserted for longer than a specified period of time and a normal mode signal is asserted; and
a mode selector, the mode selector configured to
   assert the fast mode signal if the input of the power switching circuit comprises a frequency that exceeds a threshold frequency, and
   assert the normal mode signal if the input of the power switching circuit comprises a frequency that does not exceed the threshold frequency.

12. The semiconductor circuit of claim 11, wherein the error filter is further configured to reset the error flag if the output of the comparator is not asserted for a predetermined period of time.

13. The semiconductor circuit of claim 11, further comprising a microprocessor interface coupled to the error flag.

14. The semiconductor circuit of claim 13, further comprising a microprocessor coupled to the microprocessor interface.

15. A data transmission system comprising:
an output amplifier comprising a power transistor;
a current sensor coupled to the power transistor; and
a comparator comprising
   a first input coupled to the current sensor, and
   a second input coupled to a reference;
an error filter coupled to an output of the comparator and an input of the output amplifier, the error filter configured to set an error flag if the output of the comparator is asserted during a last interval of a signal pulse at the input of the output amplifier, wherein the error filter is configured to set the error flag if
   the output of the comparator is asserted during a last interval of a signal pulse at the input of the output amplifier and a fast mode signal is asserted, or
   the output of the comparator is asserted for longer than a specified period of time and a normal mode signal is asserted; and
a mode selector, the mode selector configured to
   assert the fast mode signal if the input of the output amplifier comprises a frequency that exceeds a threshold frequency, and
   assert the normal mode signal if the input of the output amplifier comprises a frequency that does not exceed the threshold frequency.

16. The data transmission system of claim 15, further comprising a microprocessor interface comprising an input coupled to the error flag, the microprocessor interface coupled to a microprocessor bus.

17. The data transmission system of claim 15, wherein the power transistor comprises a DMOS transistor comprising:
a drain terminal coupled to an output load; and
a gate terminal coupled to a gate driver circuit, the gate driver circuit coupled to the input of the output amplifier.

18. The data transmission system of claim 17, wherein the current sensor comprises an MOS transistor comprising:
a drain terminal coupled to the output load;
a gate terminal coupled to the gate driver circuit; and
a source terminal coupled to a current sense resistor, wherein the source terminal comprises an output of the current sensor.

* * * * *